(12) United States Patent
Chee

(10) Patent No.: US 6,816,091 B1
(45) Date of Patent: Nov. 9, 2004

(54) INTERPOLATOR

(75) Inventor: Colin Chong Hin Chee, Gelugor (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/742,007

(22) Filed: Dec. 18, 2003

(51) Int. Cl.[7] .............................. H03M 1/22; G01D 5/34
(52) U.S. Cl. ..................................... 341/13; 250/231.13
(58) Field of Search .......................... 341/13, 159, 111; 250/231.16, 231.13, 214 C; 700/30; 327/107

(56) References Cited

U.S. PATENT DOCUMENTS

| | | | | |
|---|---|---|---|---|
| 3,675,238 A | * | 7/1972 | Butscher | 341/159 |
| 4,691,101 A | * | 9/1987 | Leonard | 250/231.16 |
| 4,904,861 A | * | 2/1990 | Epstein et al. | 250/214 C |
| 5,554,945 A | * | 9/1996 | Lee et al. | 327/105 |
| 5,844,814 A | * | 12/1998 | Chliwnyj et al. | 700/30 |
| 5,907,298 A | * | 5/1999 | Kiriyama et al. | 341/111 |
| 6,191,415 B1 | * | 2/2001 | Stridsberg | 250/231.13 |
| 6,255,866 B1 | * | 7/2001 | Wolaver et al. | 327/107 |
| 6,355,927 B1 | * | 3/2002 | Snyder | 250/231.13 |

OTHER PUBLICATIONS

Glenn (US Application No. 10/039,374; Pgpub 2003/0122588) "Voltage controller for a highly linear phase interpolator", filed on Jan. 2, 2002.*

* cited by examiner

Primary Examiner—Jean Bruner Jeanglaude

(57) ABSTRACT

An interpolation circuit and method for interpolating first and second out-of-phase ramp signals are disclosed. The interpolation circuit generates fractional ramp signals from the ramp signals and utilizes four multiplexers and two comparators to compare selected ones of the ramp signals. The comparator outputs are used by a finite state machine to provide a next state for the interpolator from the current state and the comparator outputs. The signals selected by the multiplexers are determined by the current state generated by the finite state machine. The finite state machine also detects a startup condition and determines the correct current state from the comparator outputs when different ramp signals are applied to the comparators. The ramp signals can be generated from out-of-phase signals from an optical comparator. The interpolation circuit generates new out-of-phase signals having a larger number of states per cycle.

10 Claims, 8 Drawing Sheets

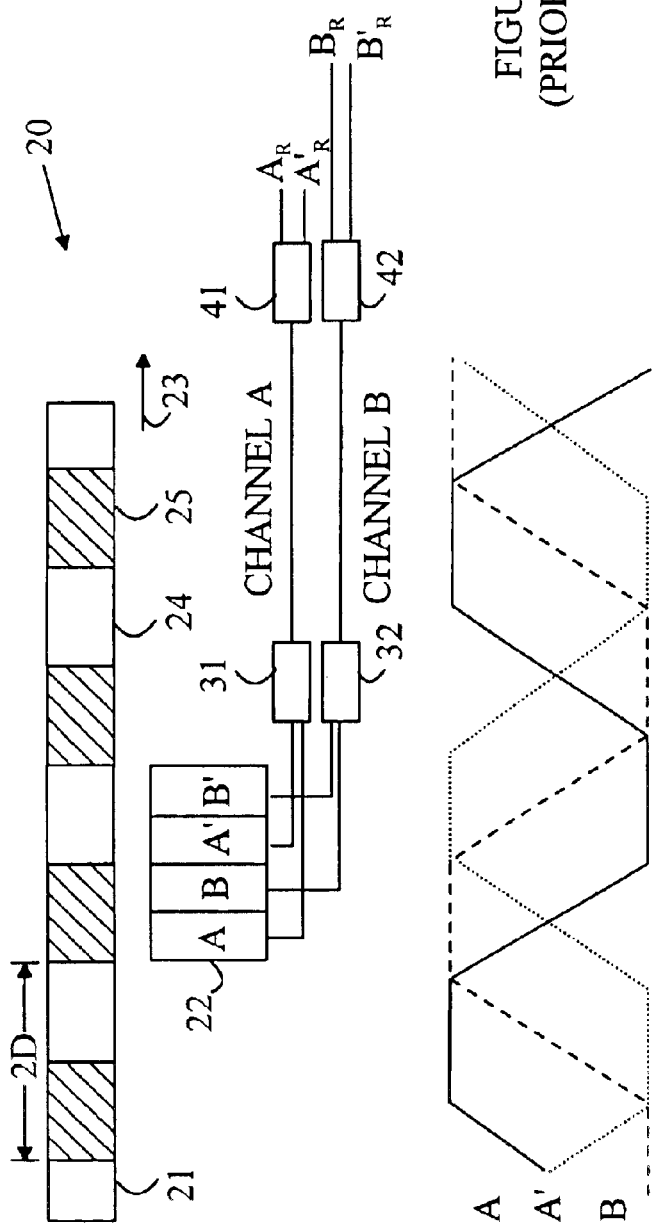
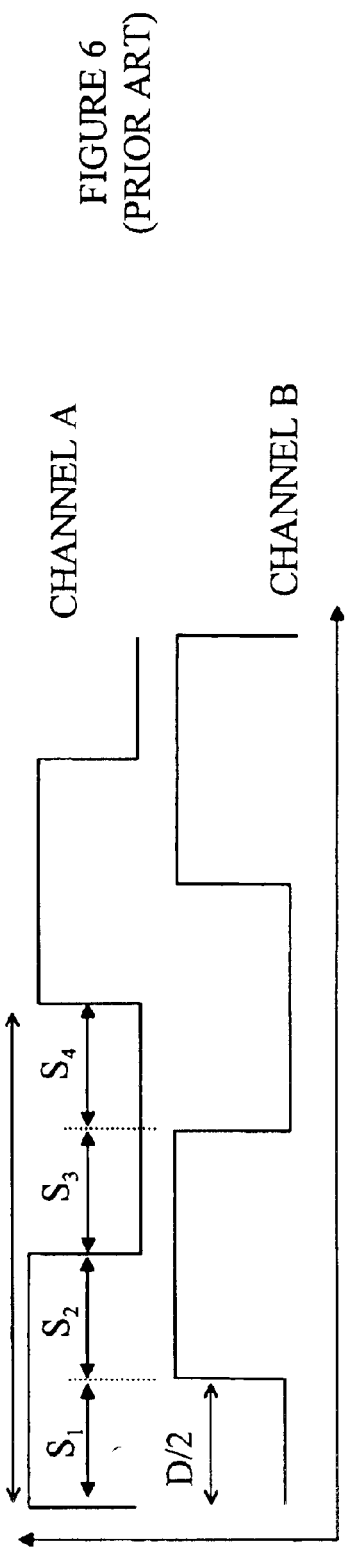

FIGURE 11

| State | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| $C_I+$ | $A'_R/3$ | $A'_R/3$ | $B'_R/3$ | $B'_R/3$ | $B'_R/3$ | $B'_R/3$ | $B_R$ | $B_R$ | $B'_R$ | $B'_R$ | $A'_R$ | $A'_R$ | $A'_R$ | $A'_R$ | $A'_R/3$ | $A'_R/3$ |
| $C_I-$ | $B'_R$ | $B'_R$ | $A'_R$ | $A'_R$ | $A_R$ | $A_R$ | $A'_R/3$ | $A'_R/3$ | $A'_R/3$ | $A'_R/3$ | $B'_R/3$ | $B'_R/3$ | $B'_R/3$ | $B'_R/3$ | $B_R$ | $B_R$ |
|  |  |  |  |  |  |  |  |  |  |  |  |  |  |  |  |  |
| $C_O+$ | $B_R$ | $B'_R$ | $B'_R$ | $A'_R$ | $A'_R$ | $A_R$ | $A_R$ | $B'_R$ | $B'_R$ | $A'_R$ | $A'_R$ | $A_R$ | $A_R$ | $B'_R$ | $B'_R$ | $B_R$ |
| $C_O-$ | $B'_R$ | $A'_R$ | $A'_R$ | $A_R$ | $A_R$ | $B'_R$ | $B'_R$ | $B_R$ | $B_R$ | $B'_R$ | $B'_R$ | $A'_R$ | $A'_R$ | $A_R$ | $A_R$ | $B'_R$ |

FIGURE 12

| State | 16 | 17 | 18 | 19 | 20 |
|---|---|---|---|---|---|
| $C_I+$ | $B_R$ |  | $B'_R$ |  | $B'_R$ |
| $C_I-$ | $B'_R$ |  | $A_R$ |  | $A_R$ |
|  |  |  |  |  |  |
| $C_O+$ | $A_R$ | $B'_R$ |  | $B'_R$ |  |
| $C_O-$ | $A'_R$ | $A'_R$ |  | $A'_R$ |  |

INTERPOLATOR

FIELD OF THE INVENTION

The present invention relates to optical encoders.

BACKGROUND OF THE INVENTION

Optical encoders provide a readout of the position of an apparatus relative to a predetermined location. For example, an absolute shaft encoder provides a readout of the number of degrees through which the shaft has rotated since a predetermined fiducial mark was detected. An incremental encoder provides a signal each time the shaft rotates a predetermined number of degrees. Linear analogs of the above-described shaft encoder function in a similar manner.

To simplify the following discussion, the present invention will be explained in terms of a shaft encoder; however, the principles of the present invention can be applied to other forms of encoders.

Typically, a shaft encoder utilizes a code wheel having a series of light and dark strips that modulate a light source. The light from the code strip is viewed by one or more photodetectors. Typically, four detectors intercept the light signals generated by one dark and one light strip. These detectors process the light signals to provide a resolution of one half the width of a stripe. That is, the encoder provides a signal having four states that divide one dark and one light stripe into four regions. To improve the resolution of such an encoder; one must increase the number of stripes around the code wheel and decrease the size of the detectors. There is, however, a minimum size for the detectors and code strips which imposes limitation on the resolution that can be achieved by miniaturizing the code strips and detectors.

One method for improving the resolution of the encoder without shrinking the size of the code strips and detectors is to provide an interpolator that effectively divides the stripes into smaller regions. For example, U.S. Pat. No. 6,355,927 describes such an interpolator. To provide an interpolation factor of n, this invention requires a processing circuit having 2n comparators. For large values on n, the costs associated with the interpolator become significant.

SUMMARY OF THE INVENTION

The present invention includes an interpolation circuit and method for interpolating a signal. The interpolation encoder includes a circuit that generates out-of-phase ramp signals and the complements of those ramp signals. A fractional signal circuit generates one or more fractional ramp signals from the out-of-phase ramp signals. The interpolation circuit utilizes first and second comparators to compare various ones of the ramp signals and fractional ramp signals. Each comparator includes a first input and a second input and generates a comparator output signal indicative of whether the first input is greater than the second input. The interpolator utilizes first, second, third and fourth multiplexers to select which ramp signals form the inputs of the comparators. Each multiplexer has multiplexer inputs that include the ramp signals and the fractional ramp signals. Each multiplexer couples its multiplexer in puts to a corresponding input of the first comparator or of the second comparator. The input is determined by a multiplexer control signal coupled to that multiplexer. A finite state machine having state inputs that include the comparator output signals and a current state signal that indicates one of a plurality of states determines the multiplexer control signals. The finite state machine generates a next state signal from the state inputs. The current state signal is replaced by the next state signal in response to a clock signal.

One embodiment also includes a first circuit for generating the ramp signal from the first and second out-of-phase channel signals that define N states and a second circuit for generating third and fourth out-of-phase channel signals from the current state signal, the third and fourth channel signal defining M states where M>N. The fractional ramp signals can be generated by a fractional signal circuit that includes a multiplexer having multiplexer inputs that include the ramp signals and a scaling amplifier having a scaling circuit input connected to the multiplexer output. The ramp signal that is scaled at any given time being determined by the current state signal. In one embodiment, the finite state machine detects a startup condition and determines a startup state from the outputs of the comparators when selected current state signals are generated.

BRIEF DESCRIPTION OF THE DRAWING

FIG. 4 illustrates a prior art two-channel encoder design that has been utilized in single track encoders that detect the relative motion of the code strip.

FIG. 5 is a graph of the amplitude of the output of each photodetector as a function of the position of the code strip image.

FIG. 6 illustrates the channel A and channel B signals when the code strip is moving in the direction shown in FIG. 4.

FIG. 11 is a table of the inputs provided to each comparator by the four multiplexers at each of the 16 tracking states.

FIG. 12 illustrates the seek mode states for the embodiment shown in FIG. 11.

DETAILED DESCRIPTION OF THE PREFERRED EMBODIMENTS OF THE INVENTION

Figure 3:
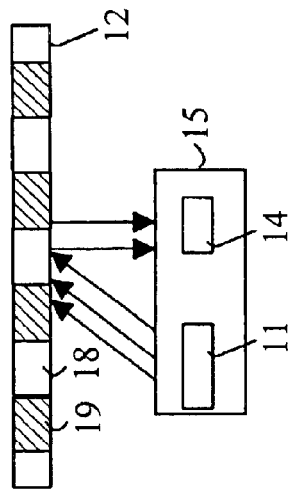
FIG. 3 illustrates an imaging encoder.
Figure 2:
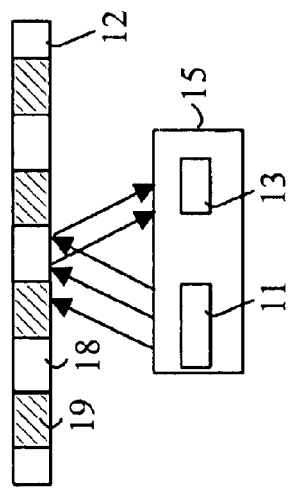
FIG. 2 illustrates a reflective encoder.
Figure 1:
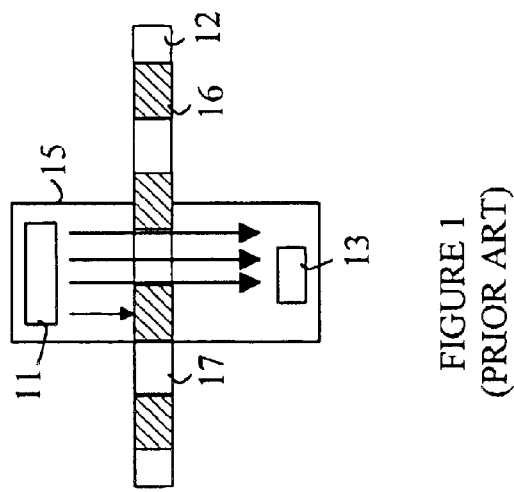
FIG. 1 illustrates a transmissive encoder.

Refer now to FIGS. 1–3, which illustrate some typical encoder designs. The encoder can be divided into an emitter/detector module 15 and a code wheel or code strip. Module 15 includes an emitter 11 that illuminates a portion of the code strip 12. A detector 13 views the illuminated code strip. The emitter typically utilizes an LED as the light source. The detector is typically based on one or more photodiodes. FIG. 1 illustrates a transmissive encoder. In transmissive encoders, the light from the emitter is collimated into a parallel beam by a collimating optic such as a lens that is part of the emitter. Code strip 12 includes opaque stripes 16 and transparent stripes 17. When code strip 12 moves between emitter 11 and detector 13, the light beam is interrupted by the opaque stripes on the code strip. The photodiodes in the detector receive flashes of light. The resultant signal is then used to generate a logic signal that transitions between logical one and logical zero.

FIG. 2 illustrates a reflective encoder. In reflective encoders, the code strip includes reflective stripes 18 and absorptive stripes 19. Again, the emitter includes a collimating optic such as a lens. The light from the emitter is reflected or absorbed by the stripes on the code strip. The reflected light is imaged onto the photodiodes in the detector. The output from the photodetectors is again converted to a logic signal.

FIG. 3 illustrates an imaging encoder. An imaging encoder operates essentially the same as the reflective encoder described above, except that module 15 includes imaging optics that form an image of the illuminated code strip on the detector 14.

In each of these types of encoders, an image of one portion of the stripe pattern is generated on the photosensitive area of a photodiode in an array of photodiodes. To simplify the following discussion, drawings depicting the image of the code strip and the surface area of the photodetectors on which the image is formed will be utilized. In each drawing, the image of the code strip will be shown next to the photodiode array to simplify the drawing. However, it is to be understood that, in practice, the image of the code strip would be projected onto the surface of the photodiode array. In addition, to further simplify the drawings, the light source and any collimating or imaging optics are omitted from the drawings.

Refer now to FIG. 4, which illustrates a prior art two-channel encoder 20 design that has been utilized in single track encoders that detect the relative motion of the code strip. Encoder 20 includes a code strip that is imaged to form an image 21 that is viewed by a detector array 22. The image 21 of the code strip consists of alternating "white" and "black" stripes shown at 24 and 25, respectively. Denote the width of each stripe in the direction of motion of the code strip by D. The direction of motion is indicated by arrow 23. For the purposes of this example, it will be assumed that when a white stripe is imaged on a detector, the detector outputs its maximum signal value, and when a black stripe is imaged on the detector, the detector outputs its minimum value. It will also be assumed that the detector outputs an intermediate value when only a portion of a white stripe is imaged onto the detector.

Detector array 22 is constructed from 4 photodetectors labeled A, A', B, and B'. Each photodetector has an active area with a width equal to D/2. The A' and B' detectors are positioned such that the A' and B' detectors generate the complement of the signal generated by the A and B detectors, respectively. The outputs of the A, A', and B photodetectors are shown in FIG. 5, which is a graph of the amplitude of the output of each photodetector as a function of position of the code strip image. To simplify FIG. 5, the output of the B' photodetector has been omitted.

The signals generated by these detectors are combined by detector circuits 31 and 32 to generate two logic channel signals that are 90 degrees out of phase as shown in FIG. 6. FIG. 6 illustrates the channel A and channel B signals when the code strip is moving in the direction shown by arrow 23 in FIG. 4. If the code strip were to move in the opposite direction, the channel B signal would lead the channel A signal; however, the two signals would still be 90 degrees out-of-phase.

Figure 7:
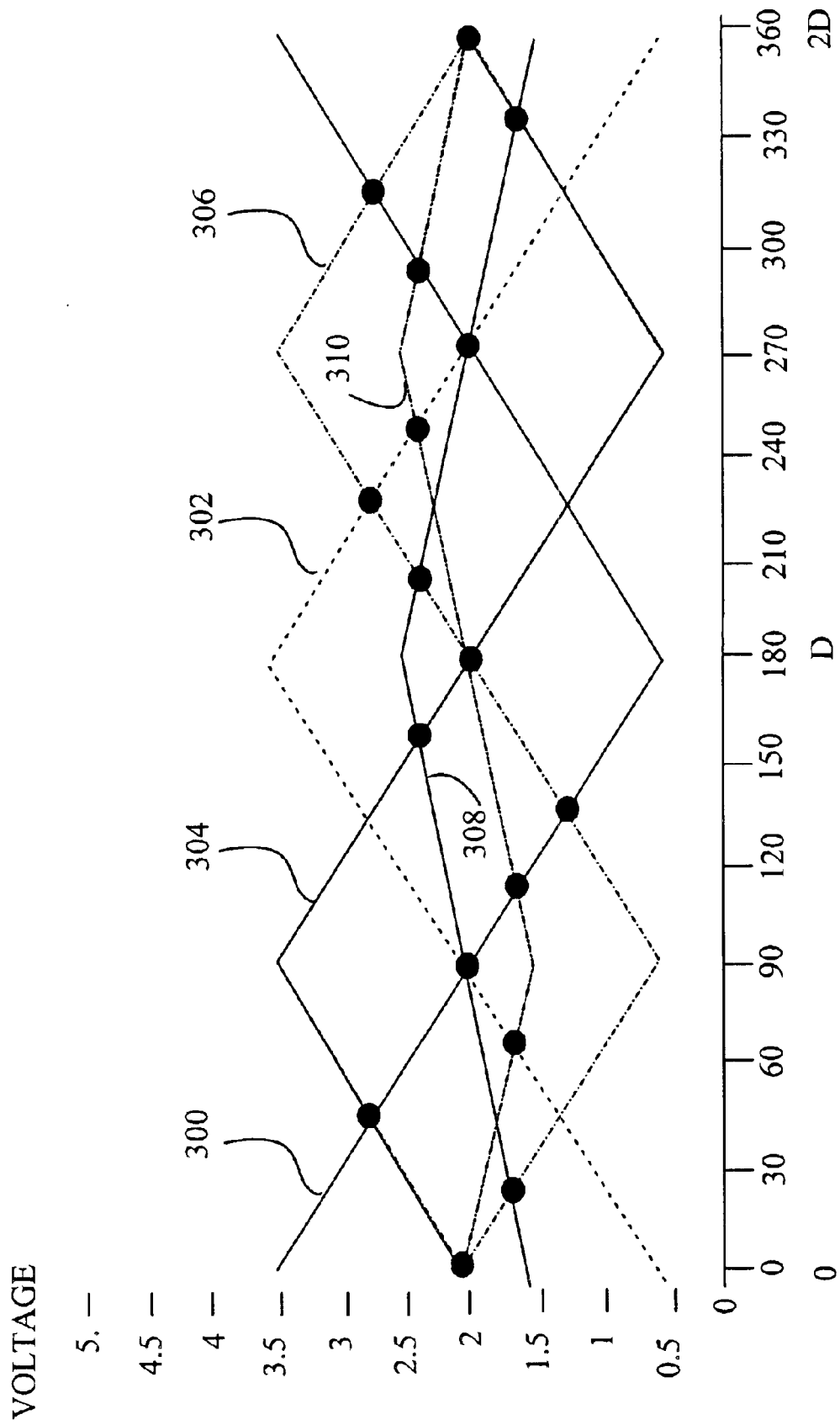
FIG. 7 illustrates exemplary ramp signals.
Figure 8:
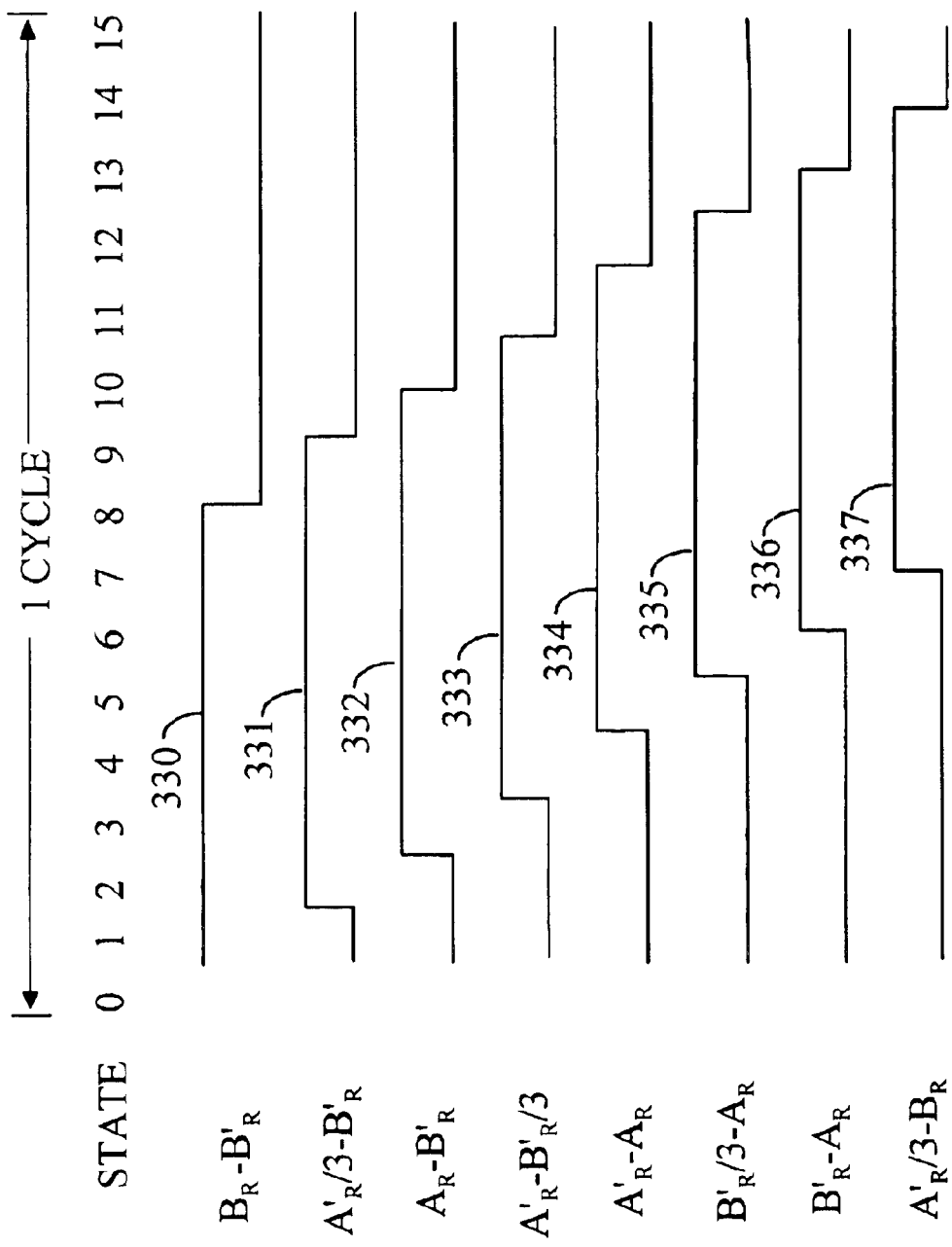
FIG. 8 illustrates how the original cycle having 4 states can be divided into a cycle having 16 states.
Figure 9:
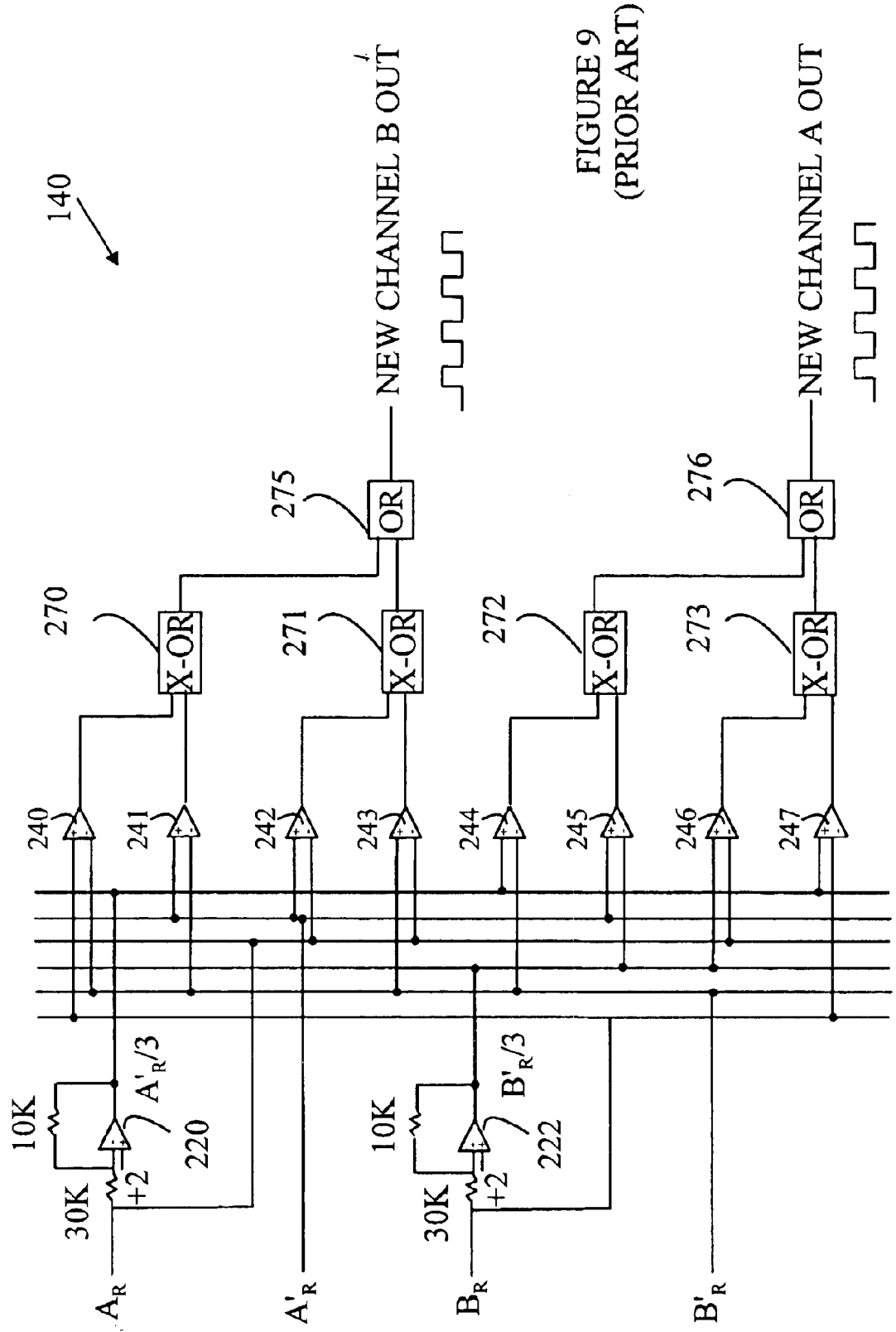
FIG. 9 is a schematic drawing of a prior art interpolator.

In the scheme taught in the above-mentioned patent, channel A and channel B signals are converted to signals that increase or decrease in time in a linear fashion by ramp circuits 41 and 42 that utilize these channel signals as inputs. Exemplary ramp signals are shown in FIG. 7. The ramp signals corresponding to the channel A and channel B signals are shown at 304 and 300, respectively. These signals will be referred to as $A_R$ and $B_R$ in the following discussion. The ramp signals shown for the complements of these signals are shown at 306 and 302, respectively. These signals will be referred to as $A'_R$ and $B'_R$ in the following discussion. The scheme taught in the '927 patent is based on the observation that if appropriate fractions of the original $A_R$, $A'_R$, $B_R$, and $B'_R$ are produced, the points at which these waveforms intersect with the original waveforms will divide the code strip image into equidistant sections. These crossing points can be combined digitally into quadrature waveforms with an interval that is several times smaller than the original interval. In the example shown in FIG. 7, the waveforms corresponding to $A'_R/3$ and $B'_R/3$ are shown at 310 and 308, respectively. If these signals are combined with the original ramp signals as shown in FIG. 8 to form the eight signals shown at 330–337, the original cycle having 4 states can be divided into a cycle having 16 states. An exemplary circuit for forming the additional ramp signals and forming the signals shown at 330–337 is shown in FIG. 9, which is a schematic drawing of a prior art interpolator 140 as taught in the '927 patent. The fractional ramp signals $A'_R/3$ and $B'_R/3$ are generated by opamps 220 and 222, respectively. The various signal differences are generated by comparators 240–247. The new channel signals are then generated by X-OR circuits 270–273 and OR circuits 275 and 276. It should be noted that this circuit requires 8 comparators and provides a factor of 4 increase in resolution.

Figure 10:
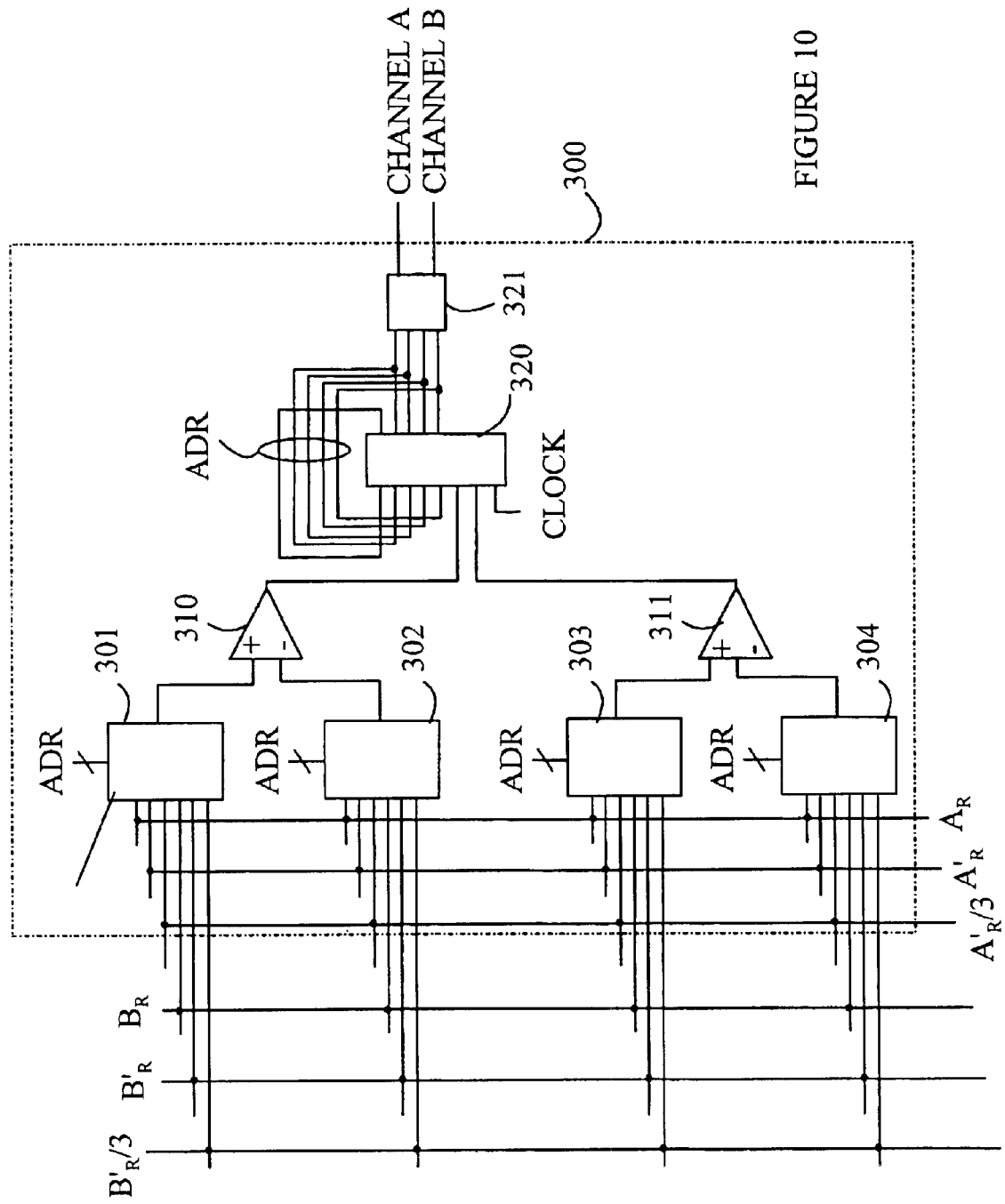
FIG. 10 is a schematic drawing of an interpolating circuit according to one embodiment of the present invention.

The present invention is based on the observation that only two of the eight comparators shown in FIG. 9 are active at any given time. The present invention uses this observation to reduce the number of comparators by utilizing multiplexers to route the appropriate signals to the comparators. Refer now to FIG. 10, which is a schematic drawing of an interpolating circuit 300 according to one embodiment of the present invention. Interpolating circuit 300 provides 16 states from the two 4-state signals generated by the encoder. Interpolating circuit 300 utilizes the same ramp signals discussed above with reference to FIG. 9, and hence, the generation of these signals will not be discussed further here. The six ramp signals, $A_R$, $A'_R$, $B_R$, $B'_R$, $A'_R/3$ and $B'_R/3$ form the inputs to the four multiplexers shown at 301–304. Each multiplexer directs one of the inputs thereto to an input of one of the comparators shown at 310 and 311. The specific inputs selected are determined by a 5-bit address signal ADR that is connected to each of the multiplexers. The outputs of the comparators are connected to a state machine 320. State machine 320 generates the next ADR signal from the current value of the ADR signal and the outputs of the comparators on the edge of a clock signal.

The current value of the ADR signal is then converted to the conventional channel A and channel B having waveforms 4 times smaller than the original channel A and Channel B signals by a state-to-quadrature converter shown at 321. Hence, the interpolation provided by this embodiment is transparent to a device receiving the interpolated output, since that output is indistinguishable from the two quadrature signals that would have been generated by a code strip and detectors having one fourth the size.

Refer now to FIG. 11, which is a table of the inputs provided to each comparator by the four multiplexers at each of the 16 tracking states. $C_1$ refers to comparator 310 and its respective positive and negative terminals. $C_0$ refers to the comparator 311 and its respective positive and negative terminals. The table shows the inputs of the comparators as provided by the multiplexers at each state. The state machine progresses to the next or to the previous state based on which of the comparators was triggered. If the comparator monitoring the 'next' state is triggered, the other comparator's inputs are switched forward to monitor the next two signals corresponding to the next state. For example, if the system is currently in state 5, $C_1$, is monitoring $B'_R/3-A_R$, and $C_0$ is monitoring $A_R-B'_R$. If $C_0$ is triggered, i.e., $A_R-B'_R>0$, then the system proceeds to state 6. In this case, $C_1$'s inputs will be switched to $B_R$ and $A_R'/3$, but $C_0$'s inputs will remain the same as it continues to watch for a change in direction. If, on the other hand, $C_0$ is triggered, the system will move to state 4. In this case, $C_1$'s inputs remain the same and $C_0$ receives new inputs.

The above-described algorithm assumes that the finite state machine is in the proper state when the code wheel moves sufficiently to change the state of the machine. This assumption is not valid at startup. Hence, some provision must be provided to seek the proper state at startup. The simplest solution to this problem is to sweep through the states until the state in which neither $C_1$ nor $C_2$ is triggered is found. It should be noted that there is only one state that satisfies this property at any given time. Hence, in this embodiment, the logic in the finite state machine is programmed such that if at a particular state, either $C_1$ and $C_0$ is triggered, i.e., outputs a logical one, the state machine proceeds to the next state. In the worst case, the initial startup would produce erroneous outputs for up to x/2 clock states where x is the interpolation factor. The time needed to reach the correct state will depend on the clock used as input to the state machine. This clock preferably has a period, which is small compared to the time the system spends in any state when the code wheel is moving.

The startup problem can also be solved by including "seek" states in the state table shown in FIG. 11. For the case shown in FIG. 11, the seek mode states are shown in FIG. 12. Upon startup, the system is switched into 'Seek' mode characterized by states 16–20. The entry point into the seek mode is state 16. In seek mode, the system uses a successive approximation procedure in which the correct state is obtained by eliminating half of the remaining states at each stage of the iteration. State 16 first divides the possible states into 4 quadrants marked by the cross points of $A_R-A'_R$ and $B_R-B'_R$ i.e. the zero-crossing points. The comparator outputs are used to determine which of these quadrants contains the correct state. Then, based on the result, the state machine switches to the next appropriate seek state which further divides the quadrant into two sub-sets and selects the one having the correct state by examining the comparator outputs. This process is then repeated until the correct state is identified. The state machine then returns to the tracking mode. If there are a large number of states, this second procedure is preferred, since it reduces the startup time.

Figure 13:
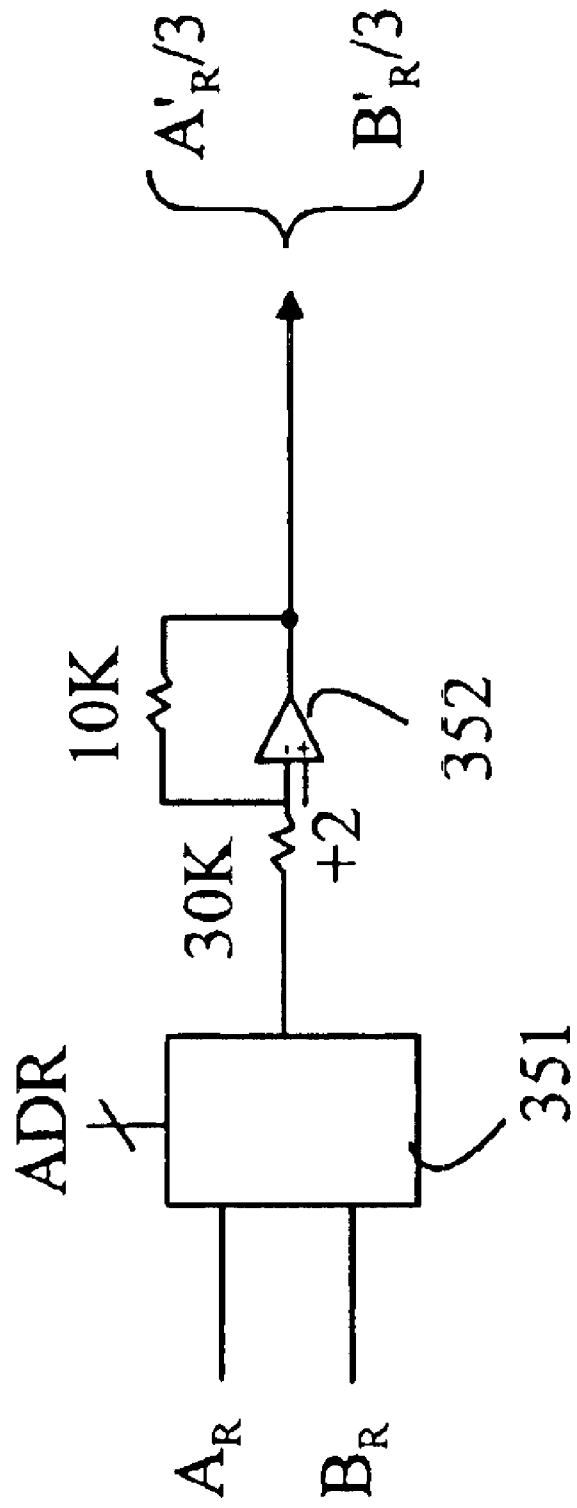
FIG. 13 illustrates a multiplexed scaling amplifier arrangement suitable for use in the embodiment shown in FIG. 10.

The above-described embodiments of the present invention utilized two separate scaling amplifiers to generate the $A'_R/3$ and $B'_R/3$ signals. However, it can be seen from FIG. 11 that only one of these signals is needed at any given state. Hence, embodiments in which a single scaling amplifier and a multiplexer replace the two separate scaling amplifiers can also be generated. Since the cost of a multiplexer is significantly less than that of a precision opamp, such embodiments provide additional cost savings. A multiplexed scaling amplifier arrangement suitable for use in the embodiment shown in FIG. 10 is shown in FIG. 13. The AR and BR signals are input to a multiplexer 351, which is controlled by the address from the state machine. The output of the multiplexer is used as an input to the scaling amplifier 352, which generated the desired scaled signal, The embodiments of the present invention discussed above utilized fractional $B'_R$ and $A'_R$ ramp signals, specifically, $A'_R/3$ and $B'_R/3$. However, embodiments that utilize fractional ramp signals or $A_R$ and $B_R$ can also be constructed.

The embodiments discussed above achieved a factor of four increase in resolution by using two fractional ramp signals. Embodiments having greater improvements in the resolution of the encoder can also be constructed by including other fractional ramp signals. For example, an embodiment having 32 states can be constructed by utilizing fractional ramp signals corresponding to of ⅓, ⅗ and ⅐ of the $A_R$ or $A'_R$ ramp signals and the same fractions of the $B_R$ or $B'_R$ ramp. In such embodiments, the multiplexers require additional inputs; however, the added cost of the multiplexers is substantially less than the added cost of the additional comparators that would be required in prior art interpolators.

Various modifications to the present invention will become apparent to those skilled in the art from the foregoing description and accompanying drawings. Accordingly, the present invention is to be limited solely by the scope of the following claims.

What is claimed is:

1. An interpolation circuit comprising:
    a circuit that generates out-of-phase ramp signals and complements of said ramp signals;
    a fractional signal circuit that generates one or more fractional ramp signals from said ramp signals;
    first and second comparators, each comparator comprising a first input and a second input and generating a comparator output signal indicative of whether said first input is greater than said second input;
    first, second, third and fourth multiplexers, each multiplexer having multiplexer inputs comprising said ramp signals and said fractional ramp signals, each multiplexer coupling said multiplexer input signals to a corresponding input of said first comparator or of said second comparator, said input being determined by a multiplexer control signal coupled to that multiplexer; and
    a finite state machine having state inputs comprising said comparator output signals and a current state signal for indicating one of a plurality of states, said finite state machine generating a next state signal from said state inputs, said current state signal being replaced by said next state signal in response to a clock signal, said current state signal determining said multiplexer control signals for each of said multiplexers.

2. The interpolation circuit of claim 1 further comprising a first circuit for generating said ramp signals from first and second out-of-phase channel signals that define N states; land a second circuit generator for generating third and fourth out-of-phase channel signals from said current state signal, said third and fourth out-of-phase channel signals defining M states, where M>N.

3. The interpolation circuit of claim 1 wherein said fractional signal circuit comprises a multiplexer having multiplexer inputs comprising said ramp signals, a select input for receiving said current state signal, and a multiplexer output; and
    a scaling amplifier having a scaling circuit input connected to said multiplexer output, said scaling amplifier generating an output signal having an amplitude that is a fraction of a signal connected to said scaling circuit input, wherein said multiplexer connects one of said multiplexer inputs to said multiplexer output in response to said current state signal.

4. The interpolation circuit of claim 1 wherein one of said fractional ramp signals comprises a signal having an amplitude that is ⅓ the amplitude of one of said ramp signals.

5. The interpolation circuit of claim 1 wherein said finite state machine detects a startup condition and wherein said finite state machine determines a startup state from the outputs of said comparators when selected current state signals are generated.

6. A method for interpolating out-of-phase ramp signals, said method comprising:

generating one or more fractional ramp signals from said ramp signals;

comparing first and second ones of said ramp signals or fractional ramp signals and second and third ones of said ramp signals or fractional ramp signals to generate a next state signal from a current state signal, wherein said first and second ones of said ramp signals or fractional ramp signals and said third and fourth ones of said ramp signals or fractional ramp signals are determined by a current state signal, and wherein said first, second, third, and fourth ones of said ramp signals or fractional ramp signals are selected utilizing multiplexers having said ramp signals and fractional ramp signals as inputs thereto.

7. The method of claim 6 wherein said first and second outputs of said phase ramp signals are generated from said first and second outputs of said phase channel signals that define a first number of states; and said method further comprising generating third and fourth out-of-phase channel signals from said current state signal, said third and fourth channel signals defining a second number of states that is greater than said first number.

8. The method of claim 6 wherein said fractional ramp signals are generated by selecting one of said ramp signals as an input to a scaling amplifier utilizing a multiplexer.

9. The method of claim 6 wherein one of said fractional ramp signals comprises a signal having an amplitude that is ⅓ the amplitude of one of said ramp signals.

10. The method of claim 6 further comprising detecting a startup condition and determining a current state signal by comparing selected ones of said ramp signals or said fractional ramp signals.

* * * * *